US010019361B2

(12) United States Patent
Catthoor et al.

(10) Patent No.: US 10,019,361 B2
(45) Date of Patent: Jul. 10, 2018

(54) LOW-LAYER MEMORY FOR A COMPUTING PLATFORM

(71) Applicant: IMEC VZW, Leuven (BE)

(72) Inventors: Francky Catthoor, Temse (BE); Praveen Raghavan, Leefdaal (BE); Matthias Hartmann, Kessel-lo (BE); Komalan Manu Perumkunnil, Kerala (IN); Jose Ignacio Gomez, Madrid (ES); Christian Tenllado, Madrid (ES)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/250,188

(22) Filed: Aug. 29, 2016

(65) Prior Publication Data

US 2017/0091094 A1 Mar. 30, 2017

(30) Foreign Application Priority Data

Sep. 24, 2015 (EP) .................................. 15186601.9

(51) Int. Cl.
*G06F 12/00* (2006.01)
*G06F 13/00* (2006.01)
(Continued)

(52) U.S. Cl.
CPC ........ *G06F 12/0811* (2013.01); *G06F 3/0611* (2013.01); *G06F 3/0656* (2013.01); *G06F 3/0685* (2013.01); *G06F 3/0688* (2013.01); *G06F 12/0893* (2013.01); *G06F 12/0897* (2013.01); *G11C 7/10* (2013.01); *G11C 11/165* (2013.01); *G06F 13/1657* (2013.01);
(Continued)

(58) Field of Classification Search
CPC ............. G06F 13/1657; G06F 13/1673; G06F 15/781; G06F 15/7846; G06F 12/0893

USPC .......................................................... 711/103
See application file for complete search history.

(56) References Cited

U.S. PATENT DOCUMENTS

2014/0289457 A1* 9/2014 Catthoor ............. G06F 12/0893
711/103

FOREIGN PATENT DOCUMENTS

WO 2013/014111 A1 1/2013

OTHER PUBLICATIONS

European Search Report, European Patent Application No. 15186601.9, dated Mar. 21, 2016, 12 pages.
Komalan, Manu Perumkunnil et al., "System Level Exploration of a STT-MRAM Based Level 1 Data-Cache", 2015 Design, Automation & Test in Europe Conference & Exhibition, Mar. 9, 2015, pp. 1311-1316.
(Continued)

*Primary Examiner* — Charles Rones
*Assistant Examiner* — Sidney Li
(74) *Attorney, Agent, or Firm* — McDonnell Boehnen Hulbert & Berghoff LLP

(57) ABSTRACT

The present disclosure relates to low-layer memory for a computing platform. An example embodiment includes a memory hierarchy being directly connectable to a processor. The memory hierarchy includes at least a level 1, referred to as L1, memory structure comprising a non-volatile memory unit as L1 data memory and a buffer structure (L1-VWB). The buffer structure includes a plurality of interconnected wide registers with an asymmetric organization, wider towards the non-volatile memory unit than towards a data path connectable to the processor. The buffer structure and the non-volatile memory unit are arranged for being directly connectable to a processor so that data words can be read directly from either of the L1 data memory and the buffer structure (L1-VWB) by the processor.

17 Claims, 6 Drawing Sheets

(51) Int. Cl.
*G06F 13/28* (2006.01)
*G06F 12/0811* (2016.01)
*G06F 3/06* (2006.01)
*G06F 12/0893* (2016.01)
*G06F 12/0897* (2016.01)
*G11C 7/10* (2006.01)
*G11C 11/16* (2006.01)
*G06F 15/78* (2006.01)
*G06F 13/16* (2006.01)

(52) U.S. Cl.
CPC ........ *G06F 13/1673* (2013.01); *G06F 15/781* (2013.01); *G06F 15/7846* (2013.01); *G06F 2212/222* (2013.01); *G06F 2212/454* (2013.01); *G11C 11/1673* (2013.01); *G11C 11/1675* (2013.01)

(56) References Cited

OTHER PUBLICATIONS

Raghavan, Praveen et al., "Very Wide Register: An Asymmetric Register File Organization for Low Power Embedded Processors", Design, Automation & Test in Europe Conference & Exhibition: Nice, France, Apr. 16, 2007, pp. 1-6.

Komalan, Manu et al., "System Level Exploration of a STT-MRAM Based Level 1 Data-Cache", Design, Automation & Test in Europe, Complutense University of Madrid (UCM), Spain, KU Leuven, IMEC, Aug. 29, 2016, 20 pages.

Hu, Jingtong et al., "Optimizing Data Allocation and Memory Configuration for Non-Volatile Memory Based Hybrid SPM on Embedded CMPs", 2012 IEEEE 26th International Parallel and Distributed Processing Symposium Workshops & PhD Forum, May 2012, pp. 982-989.

\* cited by examiner

LOW-LAYER MEMORY FOR A COMPUTING PLATFORM

CROSS-REFERENCE TO RELATED APPLICATIONS

The present application is a non-provisional patent application claiming priority to European Patent Application No. EP 15186601.9, filed Sep. 24, 2015, the contents of which are hereby incorporated by reference.

FIELD OF THE DISCLOSURE

The present disclosure generally relates to the field of techniques to deploy memory technologies in computing platforms. More in particular, it relates to the use of non-volatile memories in processor architectures.

BACKGROUND

Background memory layers L1-L2 are based on static RAM (SRAM) memories today. SRAMs nowadays are limited by sub-threshold leakage and susceptibility to read/write failures with dynamic voltage scaling schemes or a low supply voltage. As a result, considerable effort and resources are invested in developing emerging memory technologies like Resistive RAM (ReRAM), Ferroelectric RAM (FeRAM), Spin Transfer Torque Magnetic RAM (STT-MRAM) and Phase Change RAM (PRAM). Due to a variety of characteristics like low leakage, high density and inherent non-volatility, non-volatile memories (NVMs) are being explored as alternatives for SRAM memories even at higher levels of the memory hierarchy like scratch-pad and cache. Research on these NVMs has become even more necessary as memories are increasingly dominating system on chip designs in terms of chip area, performance, power consumption and manufacturing yield. In almost all proposals to incorporate NVMs into the traditional memory hierarchy, they are utilized along with SRAM. Negative impacts (latency and reliability issues being the major ones) can so be limited and the positive impacts maximized.

STT-MRAM and ReRAM are some of the more promising and mature NVM technologies. STT-MRAM is a good candidate to replace conventional SRAM technology for large-size and low-power on-chip caches. STT-MRAM has high density, lower power consumption, good performance (relative to other NVMs and Flash) and suffers minimal degradation over time (lifetime up to $10^{16}$ cycles). ReRAM is also an attractive prospect due to e.g. the large R ratio, fast read access times, small read energy consumption and area requirement. Note that the R-ratio is the ratio between the high resistive state resistance and the low resistive state resistance of the memory element. ReRAM and STT-MRAM technology are also CMOS logic compatible and can be integrated along with SRAM on chip. ReRAM, however, is plagued by severe endurance issues (lifetime≤$10^{12}$ cycles). Therefore, STT-MRAM seems the most promising NVM.

Despite the low energy, leakage and very good endurance, STT-MRAM read and write latencies are an issue when higher level memories, i.e. memories closer to the computational data path, are targeted. As a result, a direct drop-in replacement of SRAM by STT-MUM in the D-caches organization is not feasible.

There have been a number of proposals based on hybrid NVM/SRAM organizations for various levels of the memory hierarchy. They use almost all a combination of software (memory mapping, data allocation) and hardware techniques (registers, buffers, circuit level changes) to overcome the problems plaguing these proposals. In "Optimizing data allocation and memory configuration for non-volatile memory based hybrid SPM on embedded CMPs" (J. Hu, et al., IEEE 26th Int'l Parallel and Distributed Processing Symposium Workshops PhD Forum (IPDPSW), May 2012, pp. 982-989) a Hybrid Scratch Pad Memory (HSPM) architecture is proposed which consists of SRAM and NVM to utilize the ultra-low leakage power, high density of NVM and fast read of SRAM. A novel data allocation algorithm as well as an algorithm to determine NVM/SRAM ratio for the HSPM architecture are proposed.

To improve the write latency, an asymmetric write architecture with redundant blocks has been proposed, wherein the asymmetric write architecture utilizes the asymmetric write characteristics of 1T-1MTJ STT-MRAM bit-cells. The asymmetry arises from the nature of the storage element in STT-MRAM, wherein the time for the two-state transitions (1 to 0 and 0 to 1) is not identical. Others have attempted to supplement the MRAM L1 cache with several small SRAM buffers to mitigate the performance degradation and dynamic energy overhead induced by MRAM write operations. Nevertheless, only mitigating write latency does not sufficiently solve the performance issues of non-volatile memory technologies. Read latency can be addressed at the same time.

It is quite clear from work in related areas that NVMs haven't been looked into as options for the highest level of the memory hierarchy very often. Not much effort has been paid in alleviating or bypassing the read latency limitations. Additionally, the write latency oriented techniques do not lead to good results and they do not really mitigate the real latency penalty. However, when considering an ARM like general purpose processing platform, the latency issues are crucial to the success of the overall system.

The rapid increase of leakage currents in CMOS transistors with technology scaling poses a major challenge for the integration of SRAM memories. This has accelerated the desire to shift towards newer and more promising options like STT-MRAM. However, as mentioned earlier, latency issues limit the use of STT-MRAM for higher level memories. Previous concerns related to STT-MRAM and other similar NVM technologies were along the lines of write-related issues. The read latency of STT-MRAM is significantly larger than its SRAM counterpart. The read-write latency depends a lot on the R-ratio (tunnel magnetoresistance in the case of STT-MRAM) in these NVM technologies. With the maturation of the STT-MRAM technology it has become clearer that a high R-ratio is, at least currently, not realistic, taking into account the cell stability and endurance (shift from 1T-1MTJ to 2T-2MTJ). Hence, the read latency has become the new major bottleneck to overcome for substituting SRAM by STT-MRAM, particularly at the L1 level of the memory hierarchy.

Write latency issues can still be managed by techniques like the inclusion of a small L0 cache or buffers. A simulation can show that these latency issues, in particular read latency, have a major impact on performance when NVMs are used in the first levels of the memory hierarchy, even for data caches that are not so read dependent like instruction caches.

FIG. 1 shows the performance penalty on replacing just the SRAM D-cache by a NVM counterpart with similar characteristics (size, associativity . . . ). The instruction cache and the unified L2 cache remain SRAM based. Even for the minimal read latency issue considered here a clear and unacceptably large performance overhead can be observed compared with the baseline. In fact, "reg-detect" may suffer up to 55% performance penalty if the NVM data cache is introduced instead of the regular SRAM one. FIG. 2 shows the performance penalty on replacing the SRAM D-cache by a NVM counterpart with similar characteristics for a VLIW processor specialized for wireless baseband processing.

The main conclusion of this analysis is that although STT-MRAM can be a good candidate to replace SRAM data caches, a drop-in replacement may not be advisable and some architecture modifications may be used to reduce the impact of their latency limits.

Hence, there is a desire for a non-volatile memory structure for the levels of the memory hierarchy closest to the computational data path, wherein the above-mentioned problems related to read latency are at least alleviated.

SUMMARY

It is an object of embodiments described herein to provide for a low-layer memory organization wherein read latency limitations are mitigated.

The above objective is accomplished according to present embodiments.

In a first aspect, some embodiments relate to a low-layer memory for a memory hierarchy for a computing platform. The low-layer memory has at least a first layer and comprises in the first layer a non-volatile memory unit as L1 data memory and a buffer structure, the buffer structure comprising a plurality of interconnected wide registers with an asymmetric organization, wider towards the non-volatile memory unit than towards a data path. The buffer structure and the non-volatile memory unit are arranged for being directly connectable to a processor so that data words are selectable to be read or written by the processor.

The proposed solution allows exploiting data-level parallelism providing line access towards the L1 data memory while maintaining the capability of word access towards the processor. Some embodiments lead to a reduction of the read latencies visible to the processor, which improves the system performance and mitigates the performance penalties. On top of this, the proposed structure can be used to tackle write latency limitations and the corresponding performance penalties.

In an example embodiment the low-layer memory comprises a first decoding structure for allowing data transfer between the non-volatile memory unit and the buffer structure.

In another embodiment the low-layer memory comprises a second decoding structure arranged for establishing data transfer between the buffer structure and a second layer of the low-layer cache memory.

In one embodiment, the plurality of interconnected wide registers is organized in at least two rows.

In an embodiment the buffer structure has a smaller data block size than the non-volatile memory unit.

In an example embodiment the first decoding structure and the second decoding structure each comprise at least one multiplexer and at least one demultiplexer.

In one embodiment the low-layer memory comprises a controller. The controller can be arranged for performing address tag comparison and for outputting control information to the first decoding structure and/or the second decoding structure.

In an example embodiment the non-volatile memory unit is embedded.

In another embodiment the non-volatile memory unit of the low-layer memory comprises a plurality of memory subunits.

In a further embodiment the second layer of the low-layer memory comprises a plurality of memory subunits.

The low-layer memory may have the buffer structure arranged for receiving the control information.

In one embodiment the low-layer memory is a cache memory.

In another aspect, some embodiments relate to a method for operating a low-layer memory for a memory hierarchy for a computing platform, comprising the steps of: performing a profiling of memory accesses of an application to be run on the computing platform, thereby obtaining timing, address and data information of load and store operations of the application, applying, based on the profiling, access pattern transformations to migrate read intensive data blocks from a non-volatile memory unit in a first layer of a low-layer memory to a buffer structure in the first layer of the low layer memory, the buffer structure comprising a plurality of interconnected wide registers with an asymmetric organization, wider towards the non-volatile memory unit than towards a data path, executing, distributed over time, data transfers between the non-volatile memory unit and the buffer structure in the first layer of a low-layer memory using a wider data block size than the data block size for data transfers towards the data path.

In another embodiment the method further comprises executing data transfers between the non-volatile memory unit in the first layer and a second layer memory and executing data transfers from the second layer memory to the buffer structure using a same or wider data block size than the data block size towards the data path.

In another embodiment, before applying the access pattern transformations a step is performed of applying an initial set of compiler optimizations different from the access pattern transformations.

In another embodiment the method further comprises: applying repetitively vectorization and prefetching transformations until the profiling leads to convergence, and checking whether scheduling performance has reached the performance level of a single cycle memory baseline platform and, if not, applying an instruction rescheduling transformation until enough cycle slack is available for reaching the performance.

For purposes of summarizing embodiments herein, certain objects of the embodiments have been described herein above. Of course, it is to be understood that not necessarily all such objects may be achieved in accordance with any particular embodiment. Thus, for example, those skilled in the art will recognize that some embodiments may be carried out in a manner as taught herein without necessarily achieving other objects as may be taught or suggested herein.

The above and other aspects of various embodiments will be apparent from and elucidated with reference to the description hereinafter.

BRIEF DESCRIPTION OF THE FIGURES

Some embodiments will now be described further, by way of example, with reference to the accompanying drawings, wherein like reference numerals refer to like elements in the various figures.

DETAILED DESCRIPTION

Figure 1:
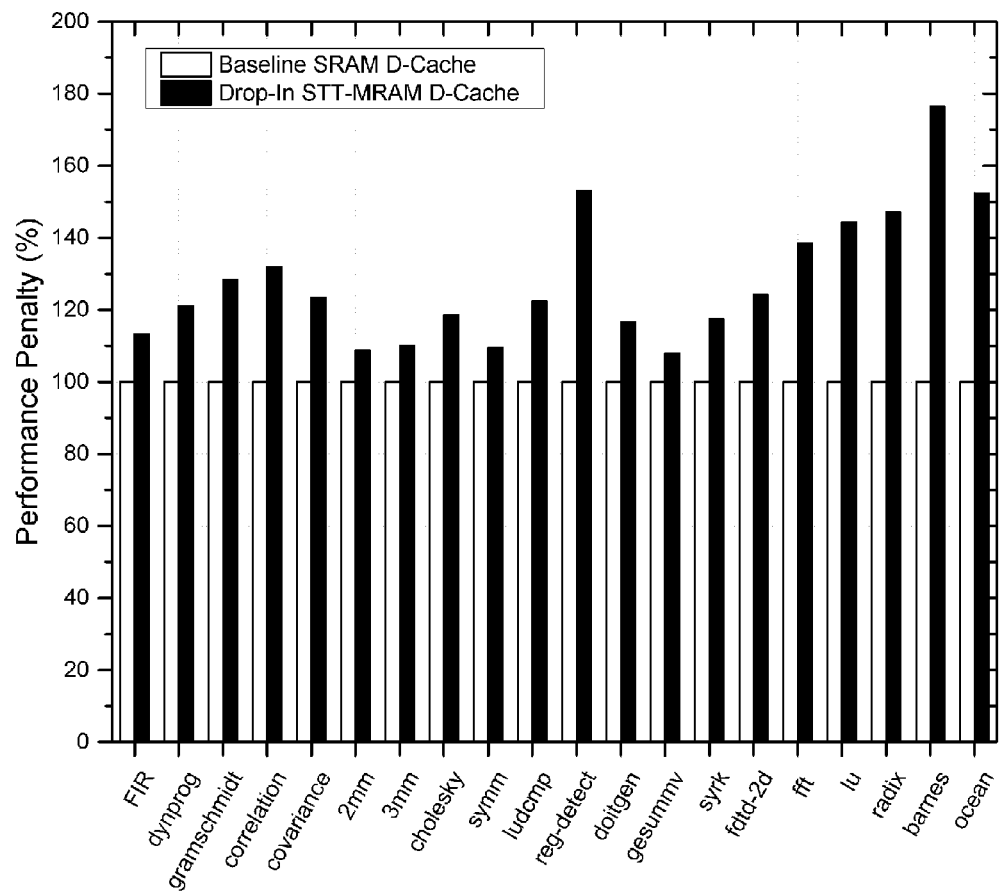
FIG. 1 illustrates the performance penalty observed when replacing SRAM D-cache by a NVM counterpart with similar characteristics, according to example embodiments.
Figure 2:
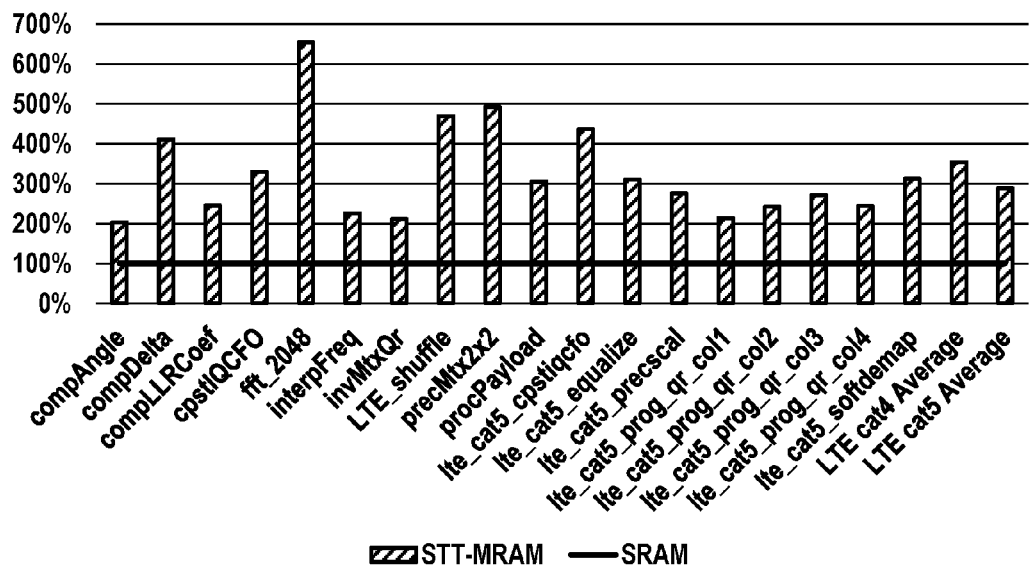
FIG. 2 illustrates the performance penalty observed when replacing a SRAM D-cache by an STT-MRAM counterpart due to the increase in write latencies of the NVM memory, according to example embodiments.

Various embodiments will be described with reference to certain drawings but are not limited thereto, but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the described embodiments, the only relevant components of the device are A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of various embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that embodiments require more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the embodiments described herein, and form different embodiments, as would be understood by those in the art. For example, in the following claims, any of the claimed embodiments can be used in any combination.

It should be noted that the use of particular terminology when describing certain features or aspects should not be taken to imply that the terminology is being re-defined herein to be restricted to include any specific characteristics of the features or aspects with which that terminology is associated.

In the description provided herein, numerous specific details are set forth. However, it is understood that embodiments may be practiced without these specific details. In other instances, well-known methods, structures and techniques have not been shown in detail in order not to obscure an understanding of this description.

Present embodiments propose a configuration for the low-layer memory of a memory hierarchy for a computing platform that is able to overcome the read limitations of the STT-MRAM by means of an intermediate buffer referred to as a "Very Wide Buffer" (VWB). The proposed solution further also has a beneficial effect on the write limitations.

The main architectural innovations introduced involve a buffer structure (L1-VWB) at the L1 level of the cache hierarchy and the associated modifications like block size changes and support structures (selector network specific as a result of the L1-VWB block size).

Figure 3:
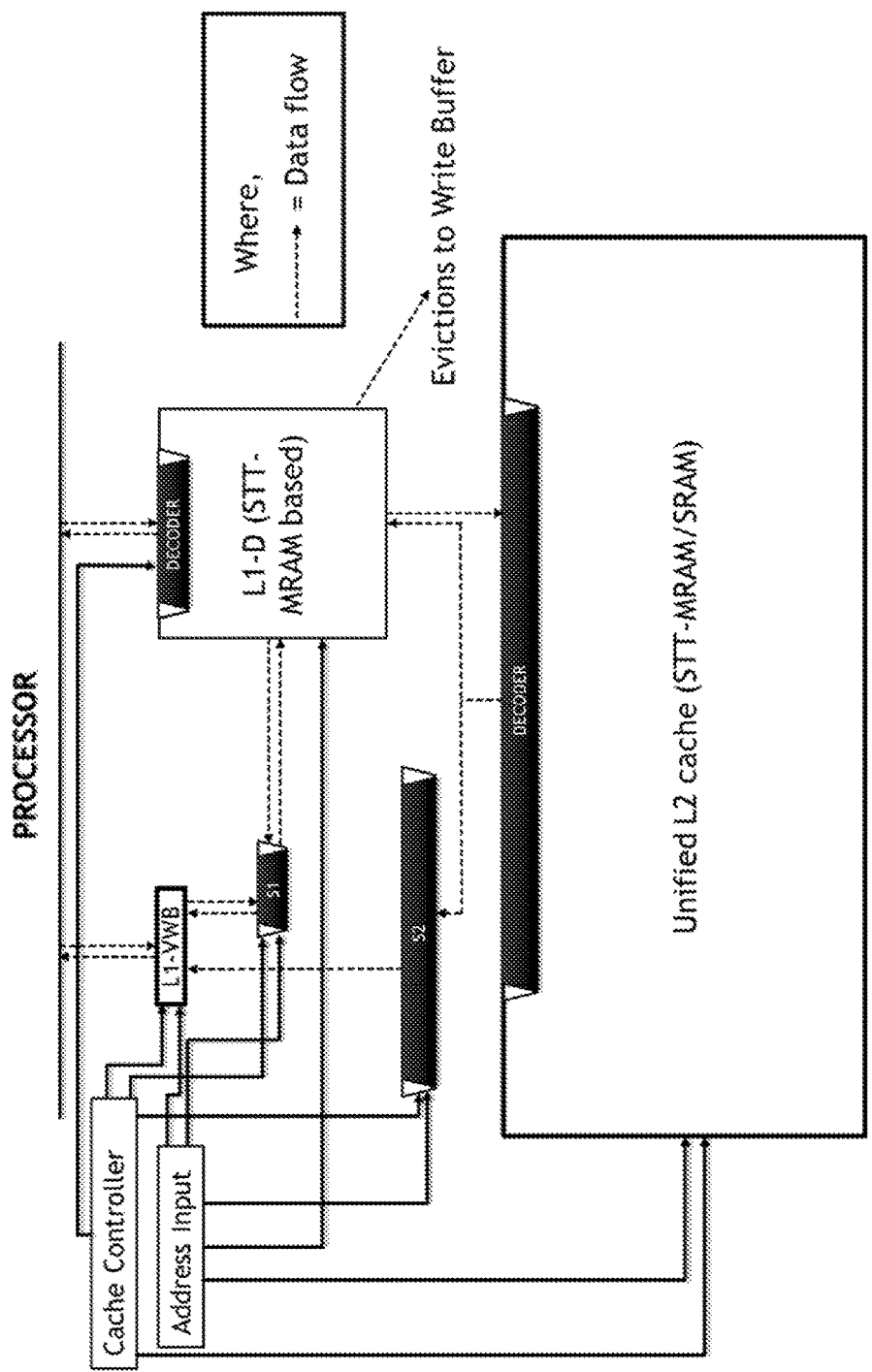
FIG. 3 illustrates a memory hierarchy comprising a low layer memory, according to example embodiments.

FIG. 3 illustrates an embodiment of the proposed memory organization. The figure shows a processor being connected to the L1 layer of the memory hierarchy. The L1 layer comprises a non-volatile memory, which can be a two-way associative STT-MRAM based data cache memory in the shown embodiment, and the buffer structure (L1-VWB). Data can flow in any direction between the processor and the L1 memory. In order to allow data transfer between the STT-MRAM memory and the buffer structure a decoding structure S1 is provided. Further a L2 cache memory is shown, which can e.g. be SRAM or STT-MRAM. Decoding structure S2 takes care of the data transfer between the buffer structure and the L2 memory. S2 is connected to the non-volatile L1 memory. Note that there is also a direct connection between the non-volatile L1 memory and the L2 memory. The address input block provides input to the various blocks of the memory structure.

Figure 4:
FIG. 4 illustrates a detailed view on an embodiment of the low layer memory, according to example embodiments.

FIG. 4 shows a more detailed view on an embodiment of the low-layer memory. The fully associative Very Wide Buffer (up-to 2 kbit) at layer L1 has an asymmetric register file organization: L1-VWB is wide towards the memory and narrower towards the data path/processor. The wide interface enables exploiting the locality of access of applications through wide loads from the memory to the VWB and wide stores from the VWB to the memory, thereby utilizing this bandwidth to hide latency. At the same time the data path is able to access words of a smaller width for the actual computations. Micro-architecturally the VWB is made of single ported cells. The VWB comprises, in an example embodiment, two rows of interconnected registers (of e.g. 1 kbit) that can ping pong the data between them. Data can be seamlessly transferred back and forth between the two rows of registers. Data can also be read or written into the L1-VWB at the same time (different rows). The data block size of the L1-VWB differs from that of the STT-MRAM based L1 data memory (which is usually not the case). This offers an increased degree of freedom while prefetching data into L1-VWB. The L1-VWB block size can for instance be taken to be the L1 data cache block size/4 (i.e. 64 bits/4=16 bits). The L1-VWB buffer structure has an associated post decode circuit comprising a multiplexer (MUX) to select the appropriate word from any row of registers, which is transferred from/to the processor/data path.

Due to the difference in the block size, there may be, as already mentioned, two extra selector/decode (MUX/DEMUX) structures S1 and S2 present in the memory hierarchy for data transfer to/from the L1-VWB. Each of these layers has inputs from the cache controller, to go along with the address and data inputs. S2 is present for data transfer from the L2 cache to L1-VWB and S1 for data transfer at L1 level between the STT-MRAM based L1-data cache and L1-VWB.

The cache controller handles the allocation of read and write operations to the L1 memory as well as to the L1 buffer structure. It also controls the potential cache evictions schemes from the L1 memory or from the L1 buffer structure and potentially distributes these data transfers over time. Since the L1 buffer structure is devoid of a corresponding tag array, the cache controller ensures accurate data transfer via control signals to the selector networks S1 and S2. This is realized by means of a table that holds all the relevant information like cache line location and way index.

The L1-VWB buffer is completely hardware controlled. It has no associated address tag tables to compare "hits" and "misses". The control lines providing input to the selector/decode network to and from the L1-VWB and the L1-VWB itself manages the "hits" and "misses" without address tag comparisons.

The load and store policies for the L1 data cache and the corresponding VWB are as follows. For a load operation both the L1-VWB and STT-MRAM L1-data cache are always first checked for the data in this scenario. If data is present in the L1-VWB, it is a hit and the data is read. If the data is present in the L1 data cache, it is read from the NVM L1-data cache into the processor and it is also written into the buffer L1-VWB. In case the data is not present in the NVM L1-data cache either, it is recorded as a L1 miss and served from the next cache level into both the L1-VWB and NVM L1 data cache. The cache line containing the data block is then transferred into the processor via L1-VWB. Evicted data from the L1-VWB is stored in the NVM L1 data cache.

For a store operation the data block in the NVM L1 data memory is updated via the L1-VWB if it is already present in it. Otherwise, it is directly updated via the processor. The L2 data block update is always via the NVM L1 data cache. A small write buffer is present to hold the evicted data temporarily, while being transferred to the L2, when the data block in question has to be renewed. No write through is present to the L2 and main memory. A write-back policy is implemented. If it is a miss, the write allocate policy is followed for the data cache array and a non-allocate policy for the L1-VWB. The data in the cache location is loaded in the block from the L2/main memory and this is followed by the write hit operation.

Regarding performance, the proposed mechanism decouples the read and write hits from the NVM, effectively removing the long latency operations from the critical path. However, long latency reads may still happen when the VWB encounters a miss and the processor may try to fetch new data while the promotion of a cache line into the VWB is taking place (since the promotion may take as long as 4 cache cycles). Moreover, long latency writes can possibly still occur when the VWB encounters a capacity conflict caused by extensive write operations over a short time period or extensive accesses with no spatially locality.

Reducing the block size of the L1 and thus limiting the data block size transferred to it would provide more room for prefetching and make the process considerably easier (transferring from STT L1-D).

Almost all modern systems try to utilize some form of parallelization nowadays for the efficient use of resources and greater performance. Data level parallelism is exploited by means of vectorization (essentially loop vectorization). Vectorization is a process wherein the program is converted from a scalar implementation, which processes a single pair of operands at a time, to a vector implementation, which processes one operation on multiple pairs of operands at once. For example, modern conventional computers, including specialized supercomputers, typically have vector operations that simultaneously perform operations such as four additions/subtractions etc. The critical data and loops are identified and vectorized.

Application profiling is performed via the assembly files and other related info that can be obtained at compile time. This yields an idea of the total number of load/store operations, the number of cycles associated with each of these operations and the general data flow during the application execution.

Figure 5:
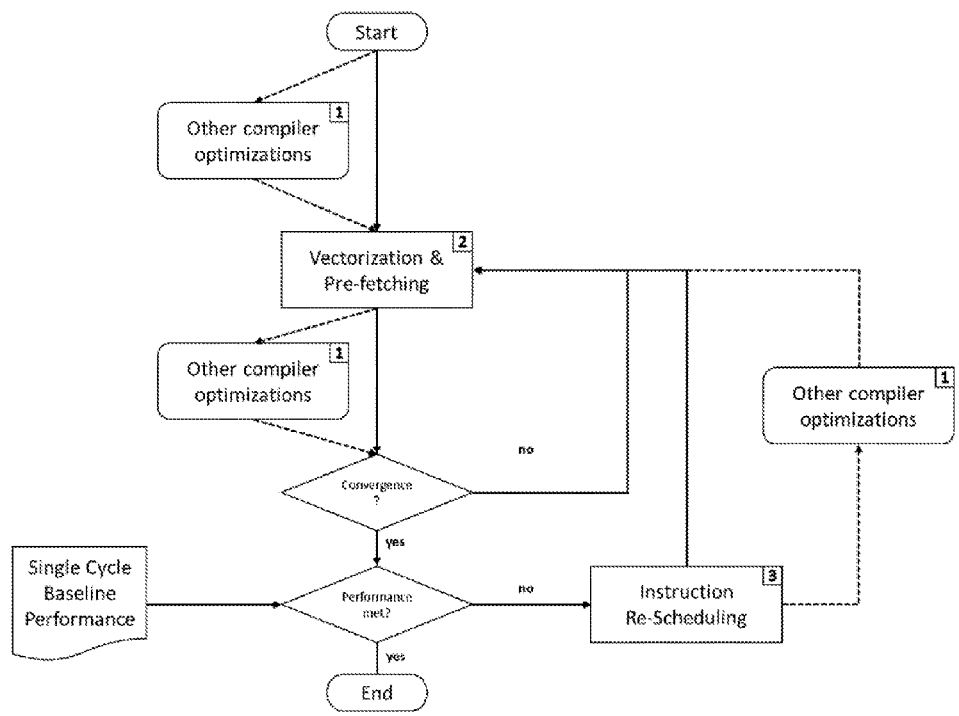
FIG. 5 illustrates the process flow of the applied memory access transformations, their ordering and their success criteria, according to example embodiments.

The initial set of compiler transformations (e.g. data block alignment, loop optimization for data-locality, data dependency checks/analysis and indirect optimizations) is applied by means of flags at compile time (FIG. 5, step 1). Access pattern transformations, i.e. the prefetching and vectorization transformations, are then applied manually in the source code via intrinsic functions depending on the initial profiling and benchmark study, respectively (FIG. 5, step 2). Prefetching to either one or to both the L1 buffer structure and DL1 can be carried out. In case the prefetching leads to unwanted evictions, i.e. convergence is not reached yet towards the access pattern schedule imposed by the single-cycle memory baseline execution (meaning that some accesses occur too late), the execution time data flow is analyzed again and corrections on the too late accesses are applied by additional prefetch transformations on the corresponding data to access the data even earlier. Once convergence is reached, it is checked whether the baseline performance (e.g. single cycle memory baseline platform) is met. If this is not the case, one modifies the instruction scheduling manually again by means of intrinsic functions to allow more degree of freedom for prefetching, i.e. more "cycle slack" is introduced that can be exploited in the prefetch transformation step (FIG. 5 block 3). This prevents less bunching of "misses" and ultimately it enables us to meet the performance target of the single-cycle memory baseline execution.

The optimization process (i.e. steps 1 and 2) is repeated based on the penalty cause (prefetching in case of conflicts, instruction scheduling in case of saving idle time for data access and vectorization for more data parallelism). The steps are repeated as shown in FIG. 5 until the performance penalty matches that of a single cycle memory baseline platform, e.g. a SRAM based L1 data cache baseline platform.

When comparing the contributions of the read and write access to the total system penalty for a NVM based proposal to enable the use of appropriate transformations, one notes that the read contribution by far exceeds that of its write counterpart towards the total penalty. With increasingly complex kernels, the write penalty contribution also seems to increase, albeit slightly. However, the clear difference in impact between the two, even in case of the data cache (as compared to the instruction cache where reads are much more critical), makes a case for applying prefetching. Here, critical data and loop arrays can be pre-fetched to the VWB manually so reducing the time to read it from the NVM.

Apart from the above listed transformations, access pattern optimizations like instruction scheduling, alignments of data blocks, data dependency checks and analysis, etc. also help in penalty reduction.

It is also attempted to transform conditional jumps in the innermost loops to branch-less equivalents, guess branch flow probabilities and to reduce number of branches taken, thus improving the code for data locality.

Some of these optimizations indirectly affect us because of the shared L2 cache: indirect optimizations.

Typically, these other optimizations are carried out automatically by specifying the individual intrinsic function flags at compile time for the different benchmarks.

Figure 6:
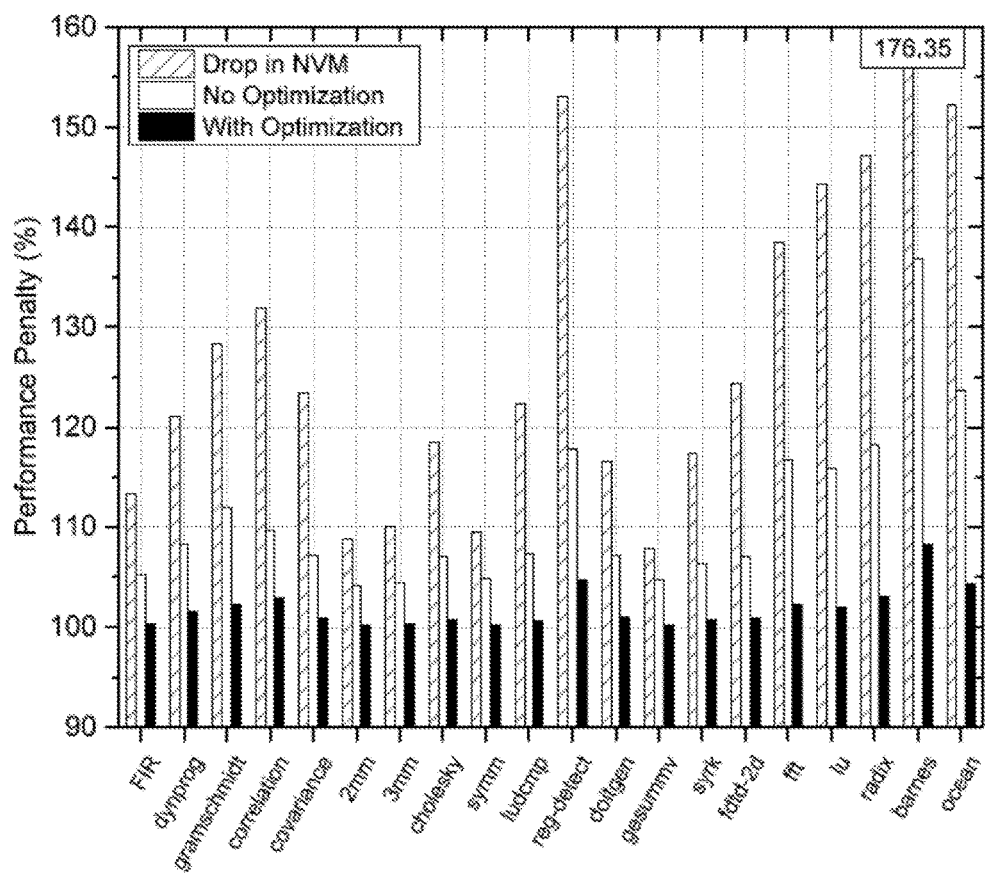
FIG. 6 illustrates the performance penalty for the modified NVM DL1 (with L1-VWB) based architecture with and without transformations. Here, the SRAM D-cache baseline is 100%, according to example embodiments.

FIG. 6 details the effects of the above mentioned transformations and optimizations on the performance of the modified STT-MRAM based DL1 organization.

A breakdown of the contribution of various code transformations to the reduction of performance penalty reveals that prefetching and vectorization have the largest positive impacts. Other intrinsic functions for alignment, branch prediction and avoiding jumps etc. become more significant as the kernel becomes larger and more complex. Predictably, prefetching is most impactful for the smallest kernels.

On the whole, in an example embodiment adaptive migration of data is carried out in such a way that read and write intensive data blocks are transferred from the NVM DL1 to L1-VWB. These transformations are steered manually by the use of intrinsic functions to modify the individual kernels. Critical data is prefetched to the L1-VWB manually and time taken to read it from the NVM DL1 is reduced. Moreover, storage operations are time-distributed and spatial locality is exploited in order to reduce the time taken to write to the NVM DL1. By means of instruction scheduling and vectorization one aims to reduce the idle time and exploit data parallelism, respectively.

Figure 7:
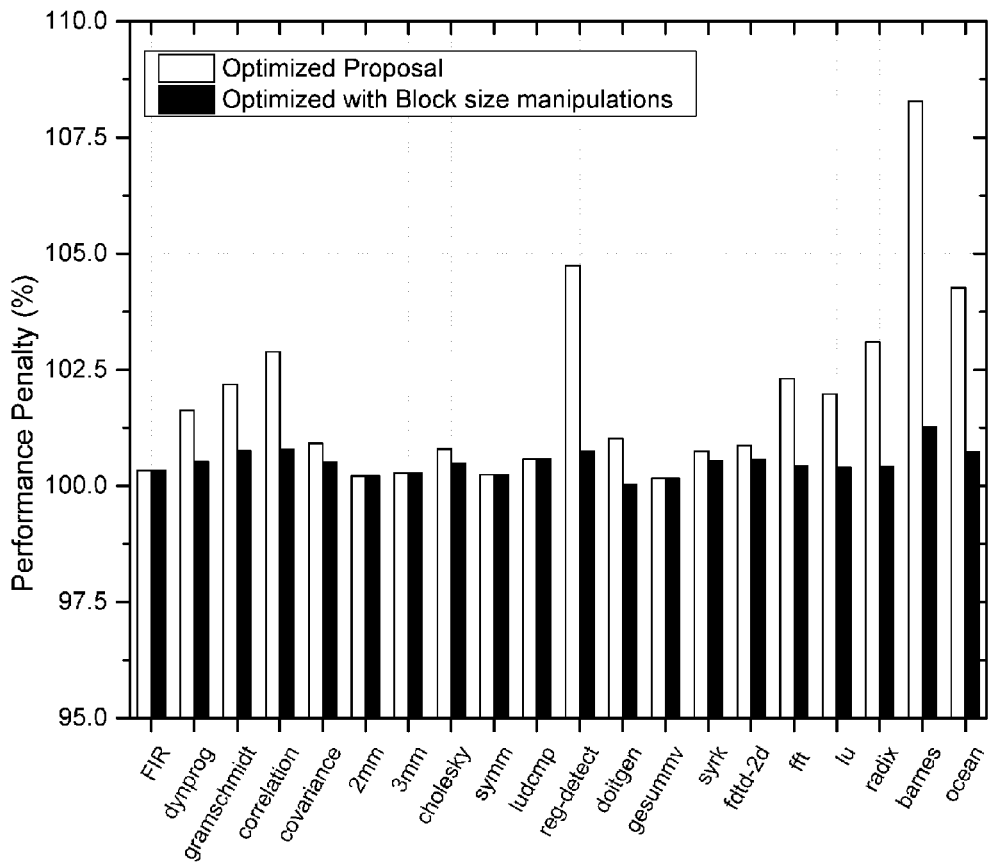
FIG. 7 illustrates the performance penalty change upon block size manipulations after transformations. Here, the SRAM D-cache baseline is 100%, according to example embodiments.

The effect of the size of the L1-VWB on the proposed solution has been studied. It is found that the increase in VWB size helps in reducing the performance penalty more. This is simply because of more data being able to fit into the VWB as a result of its increased capacity. However, a limit is present to the VWB size put forward by technology, circuit level aspects cost and energy. The routing and layout also becomes cumbersome. Hence, it is found ideal to keep the size of the L1-VWB to around 2 kbit considering the area gains offered by the NVM. A fully associative search also becomes a big problem with the increase in size of the VWB. FIG. 7 illustrates the effect of block size manipulations on the performance.

While some embodiments have been illustrated and described in detail in the drawings and foregoing description, such illustration and description are to be considered illustrative and not restrictive. The foregoing description details certain embodiments. It will be appreciated, however, that no matter how detailed the foregoing appears in text, various embodiments may be practiced in many ways. Enabled embodiments are not limited to the disclosed embodiments.

Other variations to the disclosed embodiments can be understood and effected by those skilled in the art in practicing the claims, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A memory hierarchy being directly connectable to a processor,
   wherein the memory hierarchy comprises at least a level 1, referred to as L1, memory structure comprising a non-volatile memory unit as L1 data memory and a buffer structure (L1-VWB),
   wherein the memory hierarchy comprises a first decoding structure (S1) configured to allow data transfer between the non-volatile memory unit and the buffer structure,
   wherein the buffer structure comprises a plurality of interconnected wide registers with an asymmetric organization,
   wherein a data block size used towards the non-volatile memory unit is wider than a data block size used towards a data path connectable to the processor, and
   wherein the buffer structure and the non-volatile memory unit are arranged for being directly connectable to a processor so that data words can be read directly from either of the L1 data memory and the buffer structure (L1-VWB) by the processor.

2. The memory hierarchy of claim 1, wherein the data block size used towards the data path connectable to the processor is equal to the data block size used towards the non-volatile memory unit divided by four.

3. The memory hierarchy of claim 1, further comprising a second decoding structure (S2) configured to establish data transfer between the buffer structure (L1-VWB) and a second layer (L2) of a low-layer cache memory.

4. The memory hierarchy of claim 1, wherein the buffer structure comprises a smaller data block size than the non-volatile memory unit.

5. The memory hierarchy of claim 1, wherein the first decoding structure and a second decoding structure, configured to establish data transfer between the buffer structure and a second layer of a low-layer cache memory, each comprise at least one multiplexer and at least one demultiplexer.

6. The memory hierarchy of claim 5, further comprising a controller.

7. The memory hierarchy of claim 6, wherein the controller is configured to perform address tag comparison and to output control information to the first decoding structure or the second decoding structure.

8. The memory hierarchy of claim 7, wherein the buffer structure is configured to retrieve the control information.

9. The memory hierarchy of claim 1, further comprising a second decoding structure (S2) configured to establish data transfer between the buffer structure (L1-VWB) and a second layer (L2) of a low-layer cache memory, wherein the second layer (L2) comprises a plurality of memory subunits.

10. The memory hierarchy of claim 1, wherein the non-volatile memory unit comprises a plurality of memory subunits.

11. The memory hierarchy of claim 1, wherein the memory hierarchy is a cache memory.

12. The memory hierarchy of claim 1, wherein the buffer structure and the non-volatile memory unit are arranged for being directly connectable to the processor so that data words can be written to either of the L1 data memory and the buffer structure (L1-VWB) by the processor.

13. A system, comprising:
a memory hierarchy; and
a processor connected to the memory hierarchy,
wherein the memory hierarchy comprises at least a level 1, referred to as L1, memory structure comprising a non-volatile memory unit as L1 data memory and a buffer structure (L1-VWB),
wherein the memory hierarchy comprises a first decoding structure (S1) configured to allow data transfer between the non-volatile memory unit and the buffer structure,
wherein the buffer structure comprises a plurality of interconnected wide registers with an asymmetric organization,
wherein a data block size used towards the non-volatile memory unit is wider than a data block size used towards a data path connectable to the processor, and
wherein the buffer structure and the non-volatile memory unit are arranged for being directly connectable to a processor so that data words can be read directly from either of the L1 data memory and the buffer structure (L1-VWB) by the processor.

14. The system of claim 13, wherein the data block size used towards the data path connectable to the processor is equal to the data block size used towards the non-volatile memory unit divided by four.

15. The system of claim 13, wherein the memory hierarchy further comprises a second decoding structure (S2) configured to establish data transfer between the buffer structure (L1-VWB) and a second layer (L2) of a low-layer cache memory.

16. The system of claim 13, wherein the buffer structure comprises a smaller data block size than the non-volatile memory unit.

17. The system of claim 13, wherein the non-volatile memory unit comprises a plurality of memory subunits.

* * * * *